(12) United States Patent
Li

(10) Patent No.: US 11,563,035 B2
(45) Date of Patent: Jan. 24, 2023

(54) TFT SUBSTRATE AND DISPLAY DEVICE

(71) Applicant: BOE TECHNOLOGY GROUP CO., LTD., Beijing (CN)

(72) Inventor: Haixu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 34 days.

(21) Appl. No.: 17/355,495

(22) Filed: Jun. 23, 2021

(65) Prior Publication Data

US 2021/0408065 A1 Dec. 30, 2021

(30) Foreign Application Priority Data

Jun. 29, 2020 (CN) .......................... 202021233526.1

(51) Int. Cl.
| | |
|---|---|
| *H01L 27/12* | (2006.01) |
| *H01L 27/32* | (2006.01) |
| *H01L 51/56* | (2006.01) |
| *G02F 1/1335* | (2006.01) |
| *G02F 1/1347* | (2006.01) |
| *H01L 29/786* | (2006.01) |

(52) U.S. Cl.
CPC ........ *H01L 27/1218* (2013.01); *H01L 27/127* (2013.01); *H01L 27/3272* (2013.01); *H01L 29/78633* (2013.01); *H01L 51/56* (2013.01)

(58) Field of Classification Search
CPC .............. H01L 27/1218; H01L 27/127; H01L 27/3272; H01L 29/78633; H01L 51/56
See application file for complete search history.

(56) References Cited

U.S. PATENT DOCUMENTS

| | | | | |
|---|---|---|---|---|
| 10,861,916 | B2* | 12/2020 | Liu | .......................... H01L 33/36 |
| 11,152,443 | B2* | 10/2021 | Xiao | ................... H01L 27/3272 |
| 11,251,309 | B2* | 2/2022 | Chen | ................. H01L 29/41733 |
| 2020/0119120 | A1* | 4/2020 | Feng | ................... H01L 27/3265 |
| 2020/0176506 | A1* | 6/2020 | Yu | ...................... H01L 27/14612 |
| 2021/0048904 | A1* | 2/2021 | Xia | ......................... H01L 27/323 |
| 2021/0327987 | A1* | 10/2021 | Fang | .................. H01L 27/3276 |
| 2021/0375951 | A1* | 12/2021 | Hu | .................... G02F 1/136295 |
| 2021/0384224 | A1* | 12/2021 | Tian | .................... H01L 27/1262 |
| 2021/0399024 | A1* | 12/2021 | Gong | .................... H01L 27/127 |
| 2022/0037616 | A1* | 2/2022 | Liu | ..................... H01L 51/5225 |

* cited by examiner

*Primary Examiner* — Mohsen Ahmadi
(74) *Attorney, Agent, or Firm* — Houtteman Law LLC

(57) ABSTRACT

The present disclosure provides a thin film transistor (TFT) substrate and a display device, the TFT substrate includes an base substrate and a plurality of pixel units, wherein each of the pixel units includes a TFT on the base substrate, the TFT includes a source drain layer, an active layer, and a gate layer; the TFT substrate further includes a light shielding layer on a side of the source drain layer of the TFT distal to the base substrate, and an orthographic projection of the light shielding layer on the base substrate completely covers an orthographic projection of the active layer of the TFT on the base substrate, and partially covers an orthographic projection of the gate layer of the TFT on the base substrate.

12 Claims, 2 Drawing Sheets

TFT SUBSTRATE AND DISPLAY DEVICE

CROSS REFERENCE TO RELATED APPLICATIONS

The present application claims the priority of the Chinese Patent Application No. 202021233526.1 filed on Jun. 29, 2020, the content of which is incorporated herein by reference in its entirety.

TECHNICAL FIELD

The present disclosure relates to the technical field of display devices, in particular to a TFT substrate and a display device.

BACKGROUND

With the continuous development of display technologies, people's demand for large-size screens is also increasing, and a double liquid crystal cell (DB cell) display device applicable to large-size screens is emerged.

SUMMARY

A first aspect of the present disclosure provides a thin film transistor (TFT) substrate, including an base substrate and a plurality of pixel units, wherein each of the pixel units includes a TFT on the base substrate, the TFT includes a source drain layer, an active layer, and a gate layer, and wherein the TFT substrate further includes a light shielding layer on a side of the source drain layer of the TFT distal to the base substrate, and an orthographic projection of the light shielding layer on the base substrate completely covers an orthographic projection of the active layer of the TFT on the base substrate, and partially covers an orthographic projection of the gate layer of the TFT on the base substrate.

In the embodiment, the TFT substrate further includes a via hole on the source drain layer, wherein an orthographic projection of the via hole on the base substrate is within an orthographic projection of the source drain layer on the base substrate; and the light shielding layer also partially covers the source drain layer, and a minimum distance between an edge of the orthographic projection of the light shielding layer on the base substrate and an edge of the orthographic projection of the via hole on the base substrate is greater than or equal to 2 micrometers.

In the embodiment, the edge of the orthographic projection of the light shielding layer on the base substrate protrudes outward relative to an edge of the orthographic projection of the active layer on the base substrate.

In the embodiment, the edge of the orthographic projection of the light shielding layer on the base substrate protrudes outward relative to the edge of the orthographic projection of the active layer on the base substrate by a distance of greater than or equal to 3 micrometers.

In the embodiment, the light shielding layer is a black matrix.

In the embodiment, the black matrix is made of an organic material.

In the embodiment, the TFT substrate further includes a first protective layer between the TFT and the light shielding layer for protecting the source drain layer, the active layer, and the gate layer.

In the embodiment, the first protective layer completely covers the TFT.

In the embodiment, the TFT substrate further includes a planarization layer on the TFT, wherein the planarization layer is in contact with a side of the light shielding layer, and an upper surface of the light shielding layer is flush with an upper surface of the planarization layer; or the planarization layer completely covers the TFT and the light shielding layer.

In the embodiment, the TFT substrate further includes an electrode layer including a pixel electrode layer, a common electrode layer, and a second protective layer between the pixel electrode layer and the common electrode layer, wherein the pixel electrode layer is on the planarization layer and coupled to the source drain layer through the via hole.

Another aspect of the present disclosure provides a display device, including a color filter substrate, a first TFT substrate, a second TFT substrate, a first liquid crystal layer between the color filter substrate and the first TFT substrate, a second liquid crystal layer and a wire-grid polarizer between the first TFT substrate and the second TFT substrate, and a backlight, wherein the second TFT substrate is the TFT substrate of the first aspect.

In the embodiment, a region where one pixel unit of the second TFT substrate is located corresponds to a region where one pixel unit or adjacent pixel units of the first TFT substrate are located.

DETAIL DESCRIPTION OF EMBODIMENTS

Figure 1:
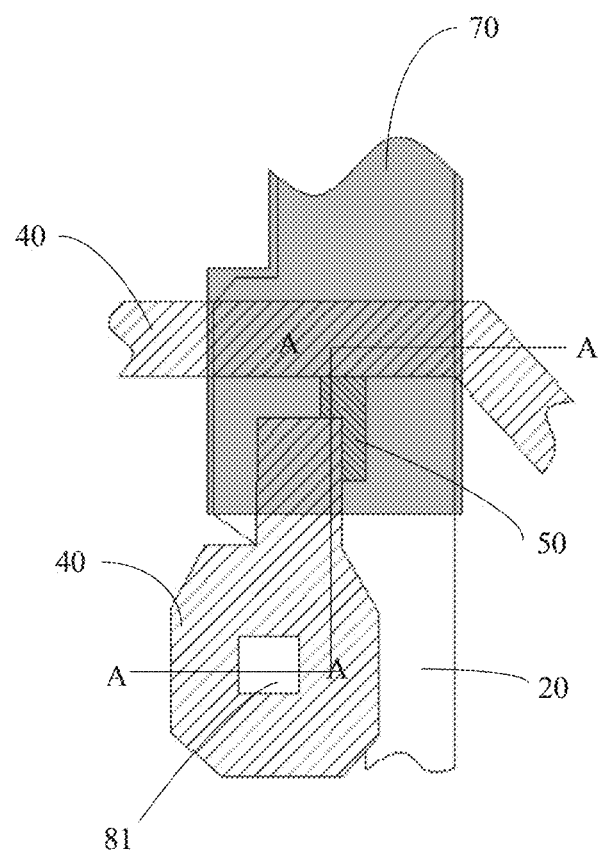
FIG. 1 is an enlarged schematic diagram of a planar structure at a TFT of a TFT substrate according to an embodiment of the present disclosure.

The present application is described in detail below and examples of embodiments of the present application are illustrated in the drawings, wherein like reference numerals refer to the same or similar elements or elements with the same or similar function throughout the description. In addition, if a detailed description of the related art is unnecessary for shown features of the present application, it is omitted. The embodiments described below with reference to the drawings are exemplary only for explaining the present application and are not construed as limiting the present application.

It will be understood by one of ordinary skill in the art that, unless otherwise defined, all terms (including technical and scientific terms) used herein have the same meaning as commonly understood by one of ordinary skill in the art to which the present application belongs. It will be further understood that terms, such as those defined in common dictionaries, should be interpreted as having a meaning that is consistent with their meaning in the context of the prior art and will not be interpreted in an idealized or overly formal sense unless expressly so defined herein.

It will be understood by one of ordinary skill in the art that, unless otherwise stated, singular forms "a", "an" and "the" as used herein are intended to include the plural forms as well. It will be understood that when an element is referred to as being "connected" or "coupled" to another element, it may be connected or coupled to the other element directly or through intervening elements. Further, "connection" or "coupling" as used herein may include wirelessly connection or wirelessly coupling. As used herein, the word "and/or" includes all or any element and all combinations of one or more of associated listed items.

It describes the technical solution of the present application and how the technical solution solves the technical problems in detail below in conjunction with specific embodiments and with reference to the drawings.

The DB cell display device includes a backlight, a first TFT (thin film transistor) substrate, a first liquid crystal layer, a wire-grid polarizer (WGP), a second TFT substrate, a second liquid crystal layer, a color filter substrate, and the like, which are sequentially stacked. The first TFT substrate and the second TFT substrate are used as photoswitches and are configured to jointly determine whether the pixel where the first TFT substrate and the second TFT substrate are located emits light, and the color filter substrate is used for generating colored light under the excitation action of the second TFT substrate to enable the display device to show colors.

However, after researching the DB cell display device, it was found that, after the light from the backlight reaches the second TFT substrate through the first TFT substrate and the first liquid crystal layer, the light is reflected by the wire-grid polarizer arranged between the first liquid crystal layer and the second TFT substrate, and a part of the reflected light is reflected onto the TFT region of the first TFT substrate. After the TFT region is irradiated, the electrical characteristics of the first TFT substrate may be changed, which may cause display abnormality of the display device.

Figure 2:
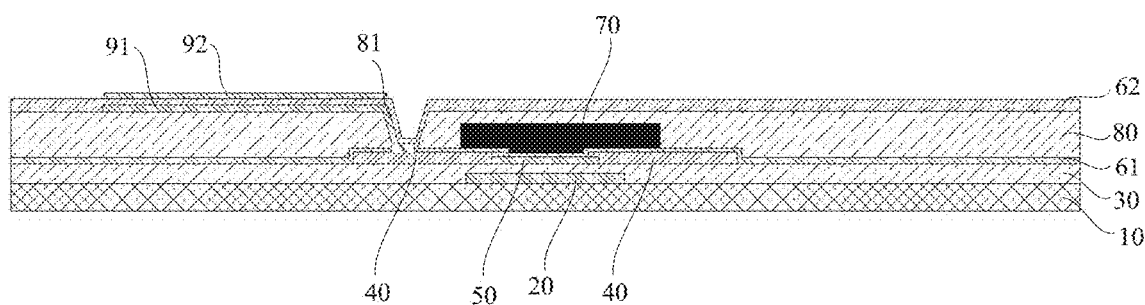
FIG. 2 is an enlarged schematic diagram of a cross-sectional structure at A-A in FIG. 1.

As shown in FIGS. 1 to 2, FIGS. 1 to 2 are an enlarged schematic diagram of a planar structure (a base substrate is not shown in drawings) and an enlarged schematic diagram of a cross-sectional structure at a TFT of a TFT substrate provided in an embodiment of the present application, respectively. The TFT substrate may include a base substrate 10 and a plurality of pixel units, and each pixel unit may include a thin film transistor (TFT) disposed on the base substrate 10; the TFT substrate may further include a light shielding layer 70, the light shielding layer 70 may be disposed on a side of a source drain layer 40 of the TFT distal to the base substrate 10, and an orthographic projection of the light shielding layer 70 on the base substrate 10 may completely cover an orthographic projection of an active layer 50 of the TFT on the base substrate 10 and cover an orthographic projection of a gate layer 20 of the TFT on the base substrate 10. In an embodiment, the source drain layer 40 may include a source electrode and a drain electrode separated from each other. In an embodiment, the TFT may include the source drain layer 40, the gate layer 20, and the active layer 50.

In an embodiment, the base substrate 10 may be a glass substrate, a gate insulating layer 30 may be further disposed on the base substrate 10, and the gate insulating layer 30 may completely cover the gate layer 20, to achieve insulation and isolation between the source drain layer 40 (and the active layer 50) and the gate layer 20. It should be noted that specific layouts and sizes of the source drain layer 40, the active layer 50, and the gate layer 20 on the base substrate 10 are not particularly limited in the present embodiment, as long as the above relationship of these layers is satisfied and the light emission control function of the TFT substrate may be achieved.

The TFT substrate provided by the present embodiment may be used as the first TFT substrate as described above. In the embodiment, the light shielding layer 70 is disposed on the source drain layer 40 of the TFT, for shielding the TFT from light, and preventing light (especially, light reflected from the WGP from an upper TFT substrate) from irradiating (most of) the active layer 50 and the gate layer 20 of metal materials, so as to effectively avoid the phenomenon that the electrical characteristics of the TFT are changed after the light is irradiated on the TFT, which may cause abnormal display of the display device, and also so as to effectively prevent the display effect of the display device from being adversely affected by stray light formed after the light reflected by the WGP is reflected by the gate layer 20. The light shielding layer 70 is disposed to cover the source drain layer 40, the active layer 50 and the gate layer 20 of the TFT, so as to shield the reflective metal as much as possible without reducing the light transmittance of the light.

In an embodiment of the present disclosure, the light shielding layer 70 may be made of a black organic material, and the light shielding layers 70 on the plurality of pixel units forms a black matrix. The light shielding layer 70 is provided in the form of the black matrix, and the black matrix is located above the gate layer 20 and the active layer 50 of the TFT, so that the light shielding effect on the gate layer 20 made of the reflective metal material and the active layer 50 is good. Further, the light shielding layer 70 may be the black matrix made of an organic material, that is, the light shielding layer 70 may be an organic material layer, and may be made of an existing organic material used as the black matrix. Compared with the metal material used as the black matrix, the material cost is lower, the light shielding layer 70 itself may be prevented from reflecting light, and the display effect of the display device may be further prevented from being adversely affected by stray light formed after light reflected by the WGP is reflected by the TFT region.

In another embodiment of the present embodiment, as shown in FIGS. 1 and 2, the TFT substrate may further include a via hole 81, the via hole 81 may be disposed above the source drain layer 40, and an orthographic projection of the via hole 81 on the base substrate 10 is located within an orthographic projection of the source drain layer 40 on the base substrate 10; the light shielding layer 70 may also partially cover the source drain layer 40, and a minimum distance between an edge of the orthographic projection of the light shielding layer 70 on the base substrate 10 and an edge of the orthographic projection of the via hole 81 on the base substrate 10 may be greater than or equal to 2 micrometers. Thus, there is a certain distance between an edge of the light shielding layer 70 and the via hole 81, so that the light shielding layer 70 may effectively keep away from the via hole 81 above the source drain layer 40. Even if a position of the via hole 81 is deviated (it may be understood that the deviation value is within a normal deviation range allowed by the process), there is still a certain distance between the light shielding layer 70 and the via hole 81, so that the light shielding layer 70 does not affect a process for the via hole, thereby preventing the light shielding layer 70 with a certain thickness from affecting a subsequent process for the via hole. In an embodiment, as shown in FIGS. 1 and 2, the via hole is generally located on an input end (i.e., either the source electrode or the drain electrode) of the source drain layer 40, and the via hole 81 is used for electrically connecting the source drain layer 40 with a pixel electrode layer 91 described below. Since the via hole 81 is generally formed on the input end of the source drain layer 40, a distance between the edge of the light shielding layer 70 and an edge of the input end may be greater than or equal to 2 micrometers to ensure that there is a certain distance between the light shielding layer 70 and the via hole 81. In an embodiment, the distance between the edge of the light shielding layer 70 and the edge of the input end may be 5 µm.

In another embodiment of the present disclosure, the edge of the orthographic projection of the light shielding layer 70 on the base substrate 10 may protrude outward relative to the edge of an orthographic projection of the active layer 50 on the base substrate 10, so that even when the active layer 50 has a process deviation (it may be understood that the deviation value is within a normal deviation range allowed by process), the light shielding layer 70 may cover the active layer 50, thereby ensuring that the light shielding layer 70 can effectively cover the active layer 50, and further ensuring the light shielding effect of the light shielding layer 70. Similarly, the edge of the orthographic projection of the light shielding layer 70 on the base substrate 10 may also protrude outward relative to an edge of an orthographic projection of the gate layer 20 on the base substrate 10 (as shown in FIG. 1), so that even when the gate layer 20 has a process deviation (it may be understood that the deviation value is within a normal deviation range allowed by process), the light shielding layer 70 may cover the gate layer 20, thereby ensuring that the light shielding layer 70 can effectively cover the gate layer 20, and further ensuring the light shielding effect of the light shielding layer 70.

Further, according to the existing manufacturing process for the gate layer 20 and the active layer 50, a process deviation for the gate layer 20 and the active layer 50 is usually within 3 micrometers, so that a distance by which the edge of the orthographic projection of the light shielding layer 70 on the base substrate 10 protrudes outward relative to the edge of the orthographic projection of the active layer 50 on the base substrate 10 or the edge of the orthographic projection of the gate layer 20 on the base substrate 10 may be greater than or equal to 3 micrometers, so that even if the positions of the gate layer 20 and the active layer 50 are deviated (it may be understood that the deviation value is within a normal deviation range allowed by process), it may ensure that the light shielding layer 70 may still cover the gate layer 20 and the active layer 50, and further ensure the light shielding effect of the light shielding layer 70.

In an embodiment, a specific arrangement and a size of the light shielding layer 70 may be set according to a specific structure and a size of the TFT (i.e., specific structures and sizes of the gate layer 20, the active layer 50, and the source drain layer 40). For example, for a TFT substrate of an embodiment where a width of the gate layer 20 may be 6 micrometers, a width of the light shielding layer 70 may be set to be 17 micrometers considering that the distance by which the edge of the orthographic projection of the light shielding layer 70 on the base substrate 10 protrudes outward relative to the edge of the orthographic projection of the active layer 50 on the base substrate 10 or the edge of the orthographic projection of the gate layer 20 on the base substrate 10 is greater than or equal to 3 micrometers.

In another embodiment of the present disclosure, the TFT substrate may further include a first protective layer 61, and the first protective layer 61 may be disposed between the TFT and the light shielding layer 70 for protecting the source drain layer 40, the active layer 50 and the gate layer 20, so as to prevent the source drain layer 40, the active layer 50 and the gate layer 20 from being damaged during the process of forming the light shielding layer 70. In an embodiment, the first protective layer 61 may be a corrosion-resistant organic insulating material. In an embodiment, the first protective layer 61 may be formed on the gate insulating layer 30 in a whole layer, and then, the via hole 81 penetrating the first protective layer 61 and a planarization layer 80 described later may be formed. The first protective layer 61 may cover the gate layer 20, the source drain layer 40, and the active layer 50 to improve the protection effect.

In another embodiment of the present embodiment, the TFT substrate may further include a planarization layer 80, the planarization layer 80 is disposed on the TFT, the planarization layer 80 is in contact with a side surface of the light shielding layer 70, and an upper surface of the light shielding layer 70 is at a same level with an upper surface of the planarization layer 80, or the planarization layer 80 completely covers the TFT and the light shielding layer 70.

In the present embodiment, since the light shielding layer 70 has a certain thickness, a step may be formed on an upper surface of the TFT (above the source drain layer 40), the planarization layer 80 may be formed on the light shielding layer 70, and the planarization layer 80 may be in contact with the side surface of the light shielding layer 70, and the upper surface of the light shielding layer 70 is at a same level with the upper surface of the planarization layer 80, or the planarization layer 80 completely covers the TFT and the light shielding layer 70 to fill in the step caused by the light shielding layer 70. Specifically, the planarization layer 80 may be made of a transparent resin material to avoid reducing the light transmittance.

In addition, the TFT substrate may further include an electrode layer disposed on the planarization layer 80, and the electrode layer may include a pixel electrode layer 91, a common electrode layer 92, and a second protective layer 62 disposed between the pixel electrode layer 91 and the common electrode layer 92. The pixel electrode layer 91 may be disposed on the planarization layer 80 and coupled to the source drain layer 40 through the via hole 81 to electrically turn on the TFT. In an embodiment, the via hole 81 may penetrate through the first protective layer 61, such that the pixel electrode layer 91 is electrically coupled to the source drain layer 40 through the via hole 81. The second protective layer 62 may protect the pixel electrode layer 91 and prevent impurities in the pixel electrode layer 91 from causing electrochemical corrosion or the like of the pixel electrode layer 91. The common electrode layer 92 may be further disposed on the second protective layer 62 to realize input of the power, thereby completing the manufacturing of the TFT substrate. In an embodiment, the common electrode layer 92 serves as an input terminal of the power, and forms a capacitor with the pixel electrode layer 91 therebetween, so that there is a threshold voltage at the pixel electrode layer 91. In an embodiment, since indium tin oxide (ITO) is a conventional material having good conductivity and transparency, both the pixel electrode layer 91 and the common electrode layer 92 may be made of the ITO.

It should be noted that the present embodiment is not limited to the structure of the TFT substrate described above, and it falls within the scope of the present application, as long as the light shielding layer 70 is formed on the source drain layer 40 of the TFT for shielding the TFT from light. For example, the TFT substrate may further include a pixel dielectric layer.

In order to verify the influence of the light shielding layer 70 on the electrical characteristics of the TFT, in the present embodiment, a test for characteristic of toplight is performed on the TFT substrate having the light shielding layer 70 and a TFT substrate having no light shielding layer 70. Three groups of samples are set in the comparison test, and are respectively (1) normal and non-illumination; (2) illumination and no light shielding layer 70; (3) illumination and having the light shielding layer 70, and the test for characteristic of toplight was performed under a same environment. Test results show that: a characteristic curve of the TFT substrate is severely deformed in the case of illumination and no light shielding layer 70, and is characterized by a significantly larger SS (sub-threshold swing) (the SS is 0.2 to 1 in the case of normal and non-illumination, but the SS goes beyond a measurable range in the case of illumination and no light shielding layer 70). In contrast, in the case of illumination and having the light shielding layer 70, the characteristic curve of the TFT substrate has no distinct difference compared with the case of normal and non-illumination. Therefore, it is found from the test results that the provision of the light shielding layer 70 may effectively suppress the influence of the light reflected from the top of the TFT substrate on the TFT and enhance the top-light characteristics of the TFT substrate.

Figure 3:
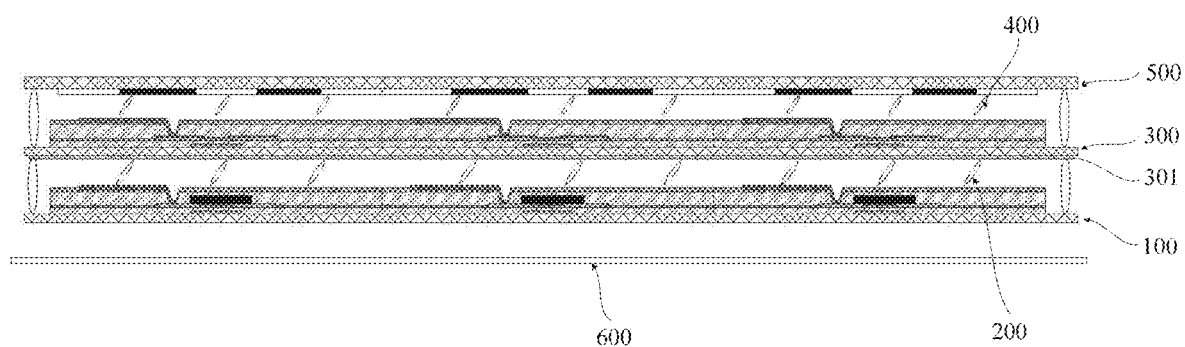
FIG. 3 is a schematic diagram of a cross-sectional structure at a TFT of a display device according to an embodiment of the present disclosure.

Based on a concept same as the above TFT substrate, the present embodiment further provides a display device. As shown in FIG. 3, the display device includes a color filter substrate 500, a first TFT substrate 300, a second TFT substrate 100, a first liquid crystal layer 400 disposed between the color filter substrate 500 and the first TFT substrate 300, a second liquid crystal layer 200 and a wire-grid polarizer 301 disposed between the first TFT substrate 300 and the second TFT substrate 100, and a backlight 600, where the second TFT substrate 100 is the TFT substrate of any one of the above embodiments.

In the embodiment, the first TFT substrate 300 and the second TFT substrate 100 both serve as photoswitches configured to determine whether the pixel where the first TFT substrate and the second TFT substrate are located emits light. The color filter substrate is used for generating colored light under the excitation action of the first TFT substrate 300 to enable the display device to show colors. The wire-grid polarizer 301 may be disposed between the first TFT substrate 300 and the second liquid crystal layer 200, and only light in a direction that be allowed by the wire-grid polarizer 301 to pass may enter the first TFT substrate 300.

In an embodiment of the present disclosure, one source drain layer 40 of the second TFT substrate 100 corresponds to four main source drain layers of the first TFT substrate 300, that is, a region where one pixel unit of the second TFT substrate 100 is located may correspond to a region where four adjacent pixel units of the first TFT substrate 300 are located. It should be noted that the display device provided in the present embodiment is not limited thereto. The region where one pixel unit of the second TFT substrate 100 is located may also correspond to a region where one pixel unit of the first TFT substrate 300 is located, which may be specifically set according to actual needs.

In the display device provided by the present embodiment, the light shielding layer 70 is disposed on each TFT of the second TFT substrate 100, and the light shielding layer 70 is disposed to cover the gate layer 20 and the active layer 50 (i.e., the TFT region) as much as possible, so as to prevent the light reflected by the wire-grid polarizer 301 on the first TFT substrate 300 from affecting the TFTs of the second TFT substrate 100, and prevent the stray light formed by the light reflected by the wire-grid polarizer 301 after being reflected by the gate layer 20 from adversely affecting the display effect of the display device, thereby improving the overall display effect of the display device.

One of ordinary skill in the art will understand that various steps, measures, schemes in operations, methods, flows discussed in the present application may be alternated, modified, combined, or deleted.

In the description of the present application, it is to be understood that the terms "center", "upper", "lower", "front", "rear", "left", "right", "vertical", "horizontal", "top", "bottom", "inner", "outer", and the like indicate orientations or positional relationships which are based on those shown in the drawings, merely for convenience in describing the present disclosure and simplifying the description, and do not indicate or imply that the indicated device or element must have a particular orientation, be constructed in a particular orientation, and be operated, and therefore, should not be construed as limiting the present disclosure.

The foregoing is only a few embodiments of the present application and it should be noted that one of ordinary skill in the art may make various improvements and modifications without departing from the principle of the present application, and that these improvements and modifications should also be considered as the protection scope of the present application.

What is claimed is:

1. A thin film transistor (TFT) substrate, comprising a base substrate and a plurality of pixel units, each of the plurality of pixel units comprising a thin film transistor (TFT) on the base substrate, and the TFT comprising a source drain layer, an active layer, and a gate layer, the source drain layer comprises a source electrode and a drain electrode, wherein the TFT substrate further comprises a light shielding layer on a side of the source drain layer of the TFT distal to the base substrate, and an orthographic projection of the light shielding layer on the base substrate completely covers an orthographic projection of the active layer of the TFT on the base substrate, and partially covers an orthographic projection of the gate layer of the TFT on the base substrate, and the TFT substrate further comprising a via hole on the source drain layer, wherein an orthographic projection of the via hole on the base substrate is within an orthographic projection of the source drain layer on the base substrate; and the light shielding layer also partially covers the source drain layer, and a minimum distance between an edge of the orthographic projection of the light shielding layer on the base substrate and an edge of the orthographic projection of the via hole on the base substrate is greater than or equal to 2 micrometers.

2. The TFT substrate of claim 1, wherein the edge of the orthographic projection of the light shielding layer on the base substrate protrudes outward relative to an edge of the orthographic projection of the active layer on the base substrate.

3. The TFT substrate of claim 2, wherein the edge of the orthographic projection of the light shielding layer on the base substrate protrudes outward relative to the edge of the orthographic projection of the active layer on the base substrate by a distance of greater than or equal to 3 micrometers.

4. The TFT substrate of claim 1, wherein the light shielding layer is a black matrix.

5. The TFT substrate of claim 1, wherein the black matrix is made of an organic material.

6. The TFT substrate of claim 1, further comprising a first protective layer between the TFT and the light shielding layer for protecting the source drain layer, the active layer, and the gate layer.

7. The TFT substrate of claim 6, wherein the first protective layer completely covers the TFT.

8. The TFT substrate of claim 1, further comprising a planarization layer on the TFT, wherein the planarization layer is in contact with a side surface of the light shielding layer, and an upper surface of the light shielding layer is at a same level with an upper surface of the planarization layer.

9. The TFT substrate of claim 8, further comprising an electrode layer including a pixel electrode layer, a common electrode layer, and a second protective layer between the pixel electrode layer and the common electrode layer, wherein the pixel electrode layer is on the planarization layer and coupled to the source drain layer through the via hole.

10. The TFT substrate of claim 1, further comprising a planarization layer on the TFT and completely covering the TFT and the light shielding layer.

11. A display device, comprising a color filter substrate, a first TFT substrate, a second TFT substrate, a first liquid crystal layer between the color filter substrate and the first TFT substrate, a second liquid crystal layer and a wire-grid polarizer between the first TFT substrate and the second TFT substrate, and a backlight, wherein the second TFT substrate is the TFT substrate of claim 1.

12. The display device of claim 11, wherein a region where one pixel unit of the second TFT substrate is located corresponds to a region where one pixel unit or adjacent pixel units of the first TFT substrate are located.

\* \* \* \* \*